(12) United States Patent
Houdeau et al.

(10) Patent No.: US 6,288,904 B1
(45) Date of Patent: Sep. 11, 2001

(54) CHIP MODULE, IN PARTICULAR FOR IMPLANTATION IN A SMART CARD BODY

(75) Inventors: Detlef Houdeau, Langquaid; Peter Stampka, Schwandorf-Klardorf; Michael Huber, Nittendorf/Undorf; Josef Heitzer, Bach, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/281,693

(22) Filed: Mar. 30, 1999

Related U.S. Application Data

(63) Continuation of application No. PCT/DE97/01921, filed on Sep. 2, 1997.

(30) Foreign Application Priority Data

Sep. 30, 1996 (DE) .............................................. 196 40 304

(51) Int. Cl.⁷ .................................................. H05K 7/02
(52) U.S. Cl. .......................... 361/760; 361/767; 361/770; 361/777; 361/783; 257/668; 257/669; 257/691; 257/786; 438/110
(58) Field of Search ................................. 361/760, 767, 361/777, 770, 783; 257/702, 711, 723, 786, 691, 668, 686; 438/107, 110, 173, 125

(56) References Cited

U.S. PATENT DOCUMENTS

| | | | |
|---|---|---|---|
| 4,560,826 | * 12/1985 | Burns et al. | 174/52 FP |
| 5,184,207 | * 2/1993 | Cain | 257/668 |
| 5,311,402 | * 5/1994 | Kobayashi et al. | 361/760 |
| 5,672,911 | * 9/1997 | Patil et al. | 257/691 |
| 5,723,899 | * 3/1998 | Shin | 257/666 |
| 5,767,447 | * 6/1998 | Dudderar et al. | 174/52.4 |
| 5,874,784 | * 2/1999 | Aoki et al. | 257/787 |
| 5,976,912 | * 10/1999 | Fukutomi et al. | 438/110 |
| 6,011,300 | * 1/2000 | Maramatsu | 257/668 |
| 6,031,724 | 2/2000 | Takahashi | 361/737 |
| 6,088,901 | 7/2000 | Huber et al. | 29/469.5 |
| 6,095,423 | 8/2000 | Houdeau et al. | 235/487 |

FOREIGN PATENT DOCUMENTS

| | | |
|---|---|---|
| 39 24 439 A1 | 4/1991 | (DE) . |
| 195 00 925 A1 | 7/1996 | (DE) . |
| 424 530 A1 | 5/1991 | (EP) . |
| 472 766 A1 | 3/1992 | (EP) . |
| 682 321 A2 | 11/1995 | (EP) . |
| 62-154971 | 10/1987 | (JP) . |
| 2-62297 | 3/1990 | (JP) . |
| 2 519 332 | 5/1996 | (JP) . |

OTHER PUBLICATIONS

International Publication WO 90/00813 (Yamaguchi), dated Jan. 25, 1990.
Japanese Patent Abstract No. 59016351(Horio Yasuhiko), dated Jan. 27, 1984.
Japanese Patent Abstract No. 58132954 (Maeda Yukio), dated Aug. 8, 1983.

* cited by examiner

*Primary Examiner*—Jeffrey Gaffin
*Assistant Examiner*—Tuan Dinh
(74) *Attorney, Agent, or Firm*—Herbert L. Lerner; Laurence A. Greenberg; Werner H. Stemer

(57) ABSTRACT

The chip module is particularly suitable for implanting in a smart card body. The module has a carrier and a chip fitted on the carrier. A pedestal or base-type elevation formed on the carrier laterally surrounds the chip completely or partly.

17 Claims, 2 Drawing Sheets

CHIP MODULE, IN PARTICULAR FOR IMPLANTATION IN A SMART CARD BODY

CROSS-REFERENCE TO RELATED APPLICATION

This is a continuation of copending International Application PCT/DE97/01921, filed Sep. 2, 1997, which designated the United States.

BACKGROUND OF THE INVENTION

Field of the Invention

The present invention relates to chip modules. Specifically, the invention pertains to a chip module that is particularly suited for implantation in a smart card body. The module has a carrier and a chip mounted on the carrier.

Chip modules of this type are known in a large number of greatly varying embodiments.

The core of any chip module is, as already indicated by the designation, a (semiconductor) chip. The chip is bonded with an adhesive onto a carrier. Generally, the carrier is produced from epoxy resin or the like, and the chip is electrically connected by means of bonding or the like to conductive structures provided on the carrier.

If the chip module is provided for use in a smart card having external contact points (provided with contacts), then the conductive structures of the carrier comprise at least the contact areas (surface contacts) of the smart card to be produced. If the chip module is provided for use in a smart card not provided with contacts, that is to say a contactless smart card, then the conductive structures of the carrier comprise at least those structures which are provided for the purpose of connection to an antenna which is arranged outside the chip module, put more precisely, to an antenna integrated in the smart card body.

In order to protect the chip, as a rule a stiffening frame, which surrounds the the chip and is normally metallic, is bonded onto the carrier and filled with a compound protecting the chip and the bonding wires (against mechanical damage and against optical analyses).

The finished chip module is finally inserted (implanted) into an appropriate cut-out in a smart card body, which results in the production of a smart card that is ready to use.

If the smart card to be produced is a smart card provided with contacts, then the implantation of the chip module into the smart card body can be performed merely by means of mechanical joining (bonding) of chip module and smart card body. Chip modules designed for such applications specifically contain, as has already been mentioned above, not only the chip itself but also the contact areas (surface contacts) located on the outside on the finished smart card, so that no electrical connection is necessary between the chip module and the smart card body.

If the smart card to be produced is a smart card which can be operated without contact, then the implantation of the chip module into the smart card body requires, in addition to the mechanical joining of chip module and smart card body, also an electrical connection of the same (in order to connect an antenna that is integrated in the smart card body to the chip contained in the chip module).

Experience has shown that, so far, contactless smart cards are not usable at all or usable only to a limited extent.

SUMMARY OF THE INVENTION

It is accordingly an object of the invention to provide a chip module, in particular a chip module for integration into a smart card, which overcomes the above-mentioned disadvantages of the heretofore-known devices and methods of this general type and which allows smart cards to be operated without direct physical contact can be reliably produced without faults in an extremely simple way by using the chip module.

With the foregoing and other objects in view there is provided, in accordance with the invention, a chip module, particularly for integration in a smart card or the like, comprising:

carrier and a chip disposed on the carrier;

the carrier being formed with a pedestal-type elevation running at least partly, or completely, around the chip.

In accordance with an added feature of the invention, the elevation is formed by an electrically conductive structure fitted onto the carrier.

In accordance with an additional feature of the invention, the elevation is a frame carrier essentially running completely around the chip, and a stiffening frame is placed on the frame carrier.

In accordance with another feature of the invention, the elevation is adapted to have casting molds placed thereon for forming a chip covering on the chip.

In accordance with a further feature of the invention, a plurality of conductor tracks and/or contact areas are formed on the carrier, and wherein the elevation is produced in concomitant production steps together with the electric conductor tracks and/or contact areas.

In accordance with again an added feature of the invention, the electric conductor tracks and/or contact areas form a constituent part of the elevation at mutual intersection points where the electric conductor tracks and/or contact areas encounter the elevation.

In accordance with again an additional feature of the invention, the elevation is formed with interruptions disposed such that parts of the elevation formed by the electric conductor tracks and/or the contact areas cannot be short-circuited by parts of the elevation not formed by the electric conductor tracks and/or contact areas.

In accordance with again another feature of the invention, the interruptions are respectively formed between the parts of the elevation formed by the electric conductor tracks and/or the contact areas and the parts of the elevation not formed by the electric conductor tracks and/or the contact areas.

In accordance with again a further feature of the invention, the interruptions are formed so as to be substantially impenetrable by a covering compound forming a chip covering.

In accordance with yet an added feature of the invention, the interruptions are formed so as to be filled with an adhesive bonding a stiffening frame onto the elevation;

In accordance with a concomitant feature of the invention, parts of the elevation formed by the electric conductor tracks and/or contact areas have a height that is equal to or smaller than a height of the parts of the elevation not formed by the electric conductor tracks and/or contact areas.

As a result of the provision of the elevation, it is possible to provide for the stiffening frame a bearing surface on which the frame can be placed over a large area and in a precisely defined position, irrespective of other structures on the relevant surface of the carrier of the chip module.

It is thus possible reliably to rule out the situation in which conductive structures such as conductor tracks and the like, which run on that surface of the carrier of the chip module on which the stiffening frame is to be arranged, can be electrically short-circuited or negatively influenced in any other way by the latter.

This applies even when at least parts of the elevation are formed by the conductive structures which are to be protected against short circuits, and the stiffening frame is "only simply" bonded onto the elevation. The possibility of being borne over a large area and uniformly, which the elevation for the stiffening frame can offer, in particular ensures that the stiffening frame can form a connection to the elevation all round only indirectly via the (preferably insulating) adhesive.

The bearing surface, which runs all around essentially without interruption and in planar fashion and which can be provided for the elevation for the stiffening frame, moreover ensures that it is not possible for any gaps, or in any case no such gap as cannot be more or less completely filled by the adhesive by means of which the stiffening frame is bonded onto the elevation, to be produced between the stiffening frame and the bearing surface on which the former is placed. This achieves the situation where a covering compound provided in order to produce a so-called globe top and with which the interior of the stiffening frame is more or less completely filled, cannot escape to the outside. This has in turn the positive effect that, otherwise than hitherto, there is no risk that conductive structures which run outside the stiffening frame and which are to be connected electrically to smart card components located outside the chip module, will be covered by a covering compound escaping from the stiffening frame, and hence made unusable for electrical connections.

Conductive structures, which are provided on that side of the carrier on which the stiffening frame is also to be placed, are therefore negatively influenced by the stiffening frame neither in their electrical properties nor in their mechanical properties.

Hence, even those conductive structures which serve to connect the chip contained in the chip module to the antenna integrated in the smart card body in particular remain uninfluenced.

This is correspondingly true for the case in which the chip, without the provision of a stiffening frame, is covered with an appropriately solid (rigid) covering compound such as a molding compound, a heat-curable covering compound or the like. In this case, the elevation can be used as a supporting surface and/or bearing surface for a casting mold or other aid. Hence it is possible to ensure, even in this case, that a maximum number of those gaps or interruptions between the casting mold and the carrier which cannot be penetrated by the covering compound used are present or remain open.

Consequently, a chip module is provided by means of which in particular smart cards whose chip modules have to be connected electrically to the smart card body, that is say inter alia also smart cards which can be operated without contact, can be reliably produced without faults in an extremely simple way by using the above-described chip module.

Accordingly, there is provided, in accordance with the invention, a smart card that is defined by a combination of a smart card body and one of the above-described chip modules integrated in the smart card body.

other features which are considered as characteristic for the invention are set forth in the appended claims.

Although the invention is illustrated and described herein as embodied in a chip module, in particular for implantation in a smart card body, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE DRAWINGS

DETAILED DESCRIPTION OF THE DRAWINGS

The chip module according to the invention can be inserted into smart card bodies like the conventional chip modules, which produces a smart card as a result. However, chip modules, of this type can be used not only for the "normal" smart cards which have become conventionally used in the art, such as telephone cards, authentication cards and the like, but in general for cards containing chips or modules of any type, that is to say, for example, also for the so-called SIM modules for mobile telephones, and the like.

The chip module which will be described below is suitable for the production of a smart card which can be used both as a smart card provided with contacts and as a contactless smart card. For reasons of simplicity, smart cards of this type will be referred to below as combination-cards.

Combination-cards are distinguished by the fact that, on the one hand, they have external connection options at predetermined locations in the form of surface contacts for wire-bound information transfer, and on the other hand have an antenna for wireless information transfer.

The surface contacts are integrated in the chip module, whereas the antenna is contained in the smart card body and has to be electrically connected to corresponding connections on the chip module (of its chip).

It will be understood that, although the below-described chip module is in particular suitable for use in combination-cards and smart cards that can be operated without contact, chip modules designed in accordance with the invention can also in principle be used advantageously in any other smart cards and chip modules.

Figure 1:
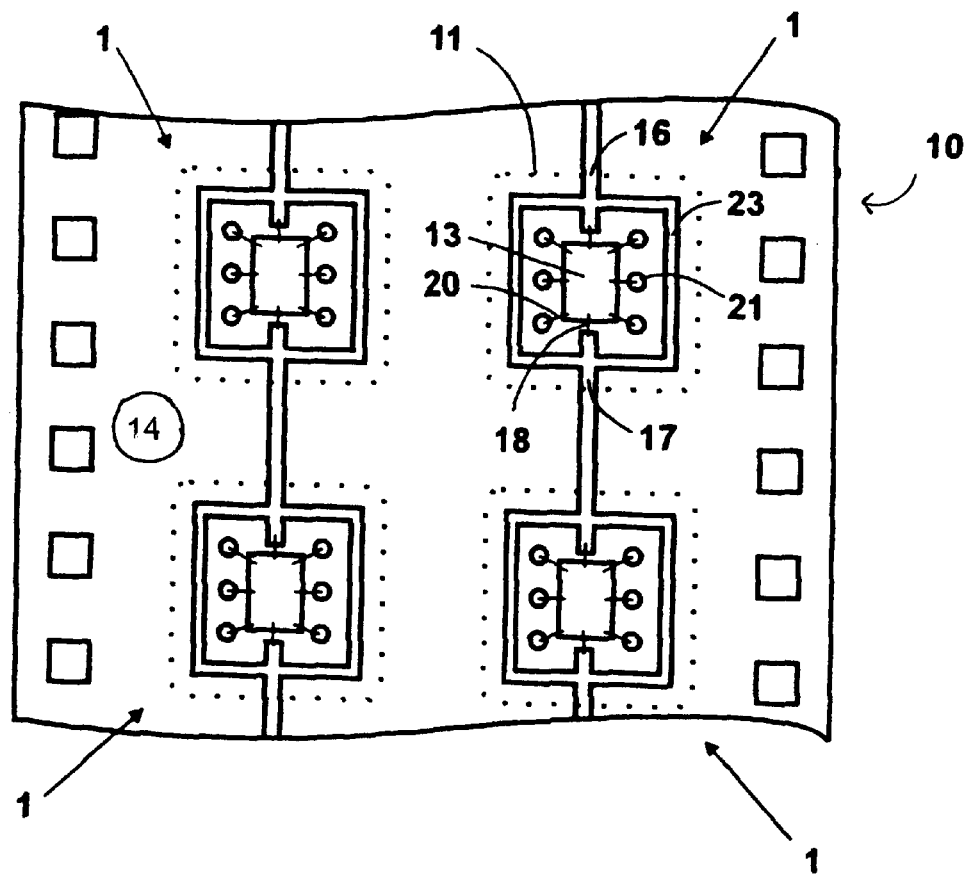
FIG. 1 is a partial plan view onto a carrier strip with a multiplicity of partly finished chip modules according to the invention.

Referring now specifically to the figures of the drawing in detail and first, particularly, to FIG. 1 thereof, there is seen a plurality of chip modules 1. The chip module 1 of the invention is one of a large number of chip modules which are constructed on a carrier 10, lying one behind another and one alongside another.

A carrier strip is preferably used as the carrier 10. A detail of such a carrier strip with four chip modules 1 that are still in production is shown in FIG. 1.

The carrier strip (consisting of an electrically insulating epoxy resin) has lateral perforation holes, which enables simple and reliable tractor transport of the carrier strip during the production of the chip modules 1. Constructed on the detail drawn of the carrier strip are four chip modules 1 which, following their finishing, are separated by cutting up or sawing up the carrier strip along the cut lines 11 drawn with dotted lines in FIG. 1.

Figure 2:
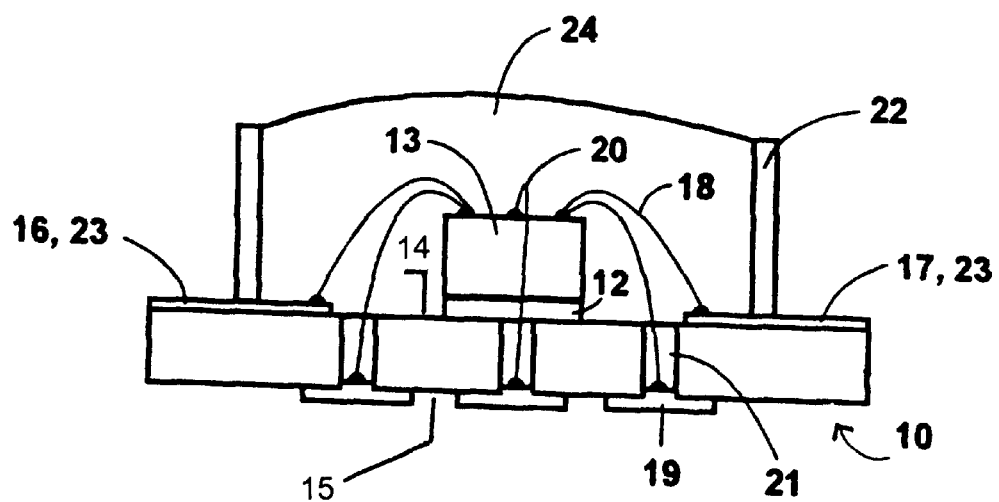
FIG. 2 is a vertical sectional view, running in steps through various levels, through a completely finished chip module according to the invention.

The construction of each chip module 1 can be seen from FIG. 1 (plan view) and from FIG. 2 (lateral sectional view);

in FIG. 2, although this is a sectional illustration, no hatching has been drawn in for reasons of better clarity.

The core of each chip module 1 is a chip 13 that is bonded onto the carrier 10 by an adhesive 12. The chip 13 is preferably connected by bonding to conductive structures provided on the carrier 10 or within the carrier 10.

The conductive structures in the example being considered are located both on the side of the carrier 10 on which the chip 13 is arranged and also on the side of the carrier 10 opposite this side. That side of the carrier 10 on which the chip 13 is arranged will be referred to below as the chip side 14 of the carrier 10, and the side of the carrier 10 lying opposite the chip side 14 will be referred to as its contact area side 15.

The conductive structures constructed on the chip side 14 of the carrier 10 comprise a first conductor track 16 running on this side of the chip 13 and a second conductor track 17 running on the other side of the chip 13, via which an antenna provided in the smart card body can be connected to the chip 13; the conductor tracks 16 and 17 are connected via bonding wires 18 to appropriate connections of the chip 13.

The conductive structures constructed on the contact area side 15 of the carrier 10 are constructed as contact areas (surface contacts) 19, via which the smart card containing the chip module 1 described can subsequently be made contact with; the contact areas 19 are connected via bonding wires 20 to appropriate connections on the chip 13, the bonding wires 20 in each case running through bonding holes 21 provided in the carrier 10.

The connections of the chip 13, via which the latter is to be connected via the conductor tracks 16 and 17 to the antenna, are not at the same time those connections which are to be connected to the connecting points 19. This makes it possible to prevent the antenna connections of the chip being short-circuited via the connecting points 19.

The chip 13 is surrounded by a stiffening frame 22, which is placed on a pedestal-type elevation in the form of a frame carrier 23 constructed on the carrier 10.

The frame carrier 23 essentially runs completely around the chip 13; it consists of the same material as the conductor tracks 16 and 17 provided on the same side of the carrier 10, that is to say on the chip side 14, and is produced together with the said conductor tracks in the same way.

At the point where the conductor tracks 16 and 17 run through under the stiffening frame 22, these simultaneously form part of the frame carrier 23. The frame carrier parts formed by the conductor tracks 16 and 17 and the frame carrier parts not formed by the conductor tracks 16 and 17 have the same height and as a result form a planar bearing surface, on which the stiffening frame 22 can be placed over a large area and in a precisely defined manner, that is to say in particular without tilting. As an alternative, provision can be made for the conductor tracks 16 and 17 to be constructed to be somewhat lower than those parts of the frame carrier 23 which are not formed by the conductor tracks 16 and 17.

In order that the conductor tracks 16 and 17 are not short-circuited or electrically influenced in any other way by the frame carrier sections which are not formed by the former and are likewise metallic, appropriate interruptions (gaps) are provided in the frame carrier 23.

These interruptions, not illustrated in the figures, are preferably provided directly alongside the conductor tracks, 16 and 17, that is say between the frame carrier parts which are formed by the conductor tracks 16 and 17 and the frame carrier parts which are not formed by the conductor tracks 16 and 17. This makes it possible to prevent the physical properties of the conductor tracks 16 and 17, in particular their capacitive and inductive reactances, from being changed excessively. However, in principle an arbitrary number of interruptions can be provided and constructed at arbitrary points on the frame carrier 23.

The width and/or the shape of the interruptions are intended to be dimensioned such that on the one hand a good electrical insulation effect is achieved, and on the other hand a gap is formed only such that a covering compound described in more detail later cannot escape through it. In the example being considered, the width of the interruption preferably lies in the range between 10 $\mu$m and 100 $\mu$m.

In order to fasten the stiffening frame 22 on the frame carrier 23 described, an electrically insulating adhesive is used. The thickness of the adhesive layer which can be introduced between the frame carrier 23 and the stiffening frame 22 varies between 10 mm and 35 mm but—in each case given the provision of the described frame carrier 23—is sufficiently great to prevent the conductor tracks 16 and 17, which certainly form parts of the frame carrier 23, being short-circuited by the stiffening frame 22, which is generally metallic. The relatively low thickness of the adhesive layer to be introduced between the frame carrier 23 and the stiffening frame 22 is therefore in particular sufficient for a good insulating effect, since the stiffening frame 22 is able to bear over a large area on the essentially planar frame carrier 23 and—otherwise than without the provision of the frame carrier 23—cannot tilt to the side over the conductor tracks 16 and 17 that project from the surface of the carrier 10, with a local reduction in the adhesive layer thickness.

Provided the above-mentioned interruptions in the frame carrier 23 are not too wide, these are closed by the insulating adhesive when the stiffening frame 22 is being bonded onto the frame carrier 23.

The region located inside the stiffening frame 22 is filled with a covering compound 24 protecting the chip 13 and the bonding wires 18 and 20 against mechanical damage and optical analyses; this produces a so-called globe top.

The covering compound 24 cannot escape from the internal space enclosed by the stiffening frame 22 and the frame carrier 23, because there are, between the stiffening frame 22 and the frame carrier 23, no openings or in any case no such openings that allow the covering compound 24 to emerge. The stiffening frame 22, the frame carrier 23 and the joint between the latter are essentially leakproof without gaps; any openings which may be present are shaped and/or dimensioned in such a way that they cannot be penetrated, or at most only to a negligible extent, by the covering compound 24. The (electrically insulating) covering compound 24 can therefore not get to conductive structures running outside the stiffening frame 22, such as the conductor tracks 16 and 17, as a result of which sections of the same to be used as contact points cannot, otherwise than hitherto, be impaired in terms of their function.

Figure 3:
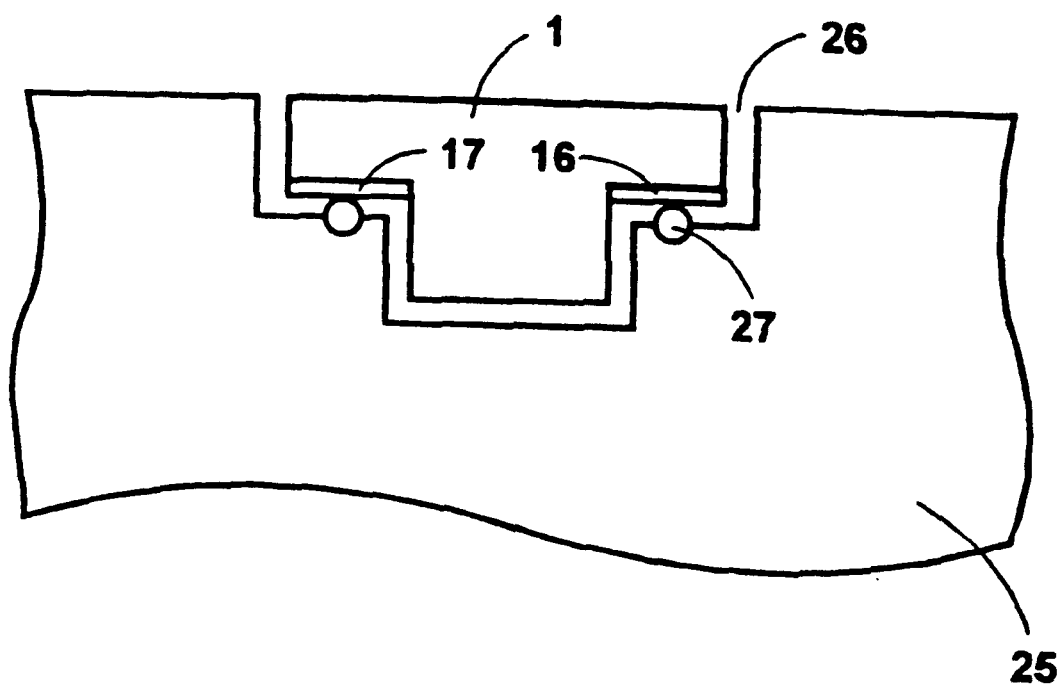
FIG. 3 is a highly schematic, partial, sectional view of a smart card body with a chip module according to the invention inserted into the smart card body.

After its finishing as shown schematically in FIG. 3, the chip module is inserted into an appropriate cut-out in a smart card body.

FIG. 3 is a very simplified illustration in which in particular the chip module 1 is illustrated only in very schematic form. Moreover, although this is a sectional view, no hatching has been drawn in, for reasons of clarity.

In FIG. 3, the smart card body is designated by the reference symbol 25, and the cut-out provided therein for the insertion of the chip module 1 is designated by the reference symbol 26.

Electrically conductive structures in the form of two at least partially freely located or exposed (antenna connecting) lines 27, which belong or lead to an antenna integrated in the smart card body 25, run through the cut-out 26.

When the chip module 1 is inserted into the cut-out 26 in the smart card body 25, the electrically conductive structures of the chip module 1, that is to say the conductor tracks 16 and 17, come at least partially into a frontal location opposite the electrically conductive structures of the smart card body 25, that is to say opposite the antenna connecting lines 27; the conductor tracks 16 and 17 at the same time come to lie over or—as is shown in FIG. 3—even on the antenna connecting lines 27.

If the chip module is inserted into the cutout 26 in the smart: card body 25 as described, then the contact areas 19 of the chip module 1 which are constructed on the contact area side 15 of the carrier 10 automatically come to lie on the outside of the smart card.

The chip module 1 is bonded to the smart card body in the position shown in FIG. 3.

The conductor tracks 16 and 17 and the antenna connecting lines 27 are additionally electrically connected to one another by means of a suitable connecting technique. This can be provided, for example, by a solder paste provided at the desired connecting point being heated to the melting temperature by means of a laser, through the carrier 10 from the outside. Provided the conductor tracks 16 and 17 and the antenna connecting lines 27 lie directly on one another, as shown in FIG. 3, they are already in contact with one another simply as a result of this, so that an additional connection by soldering or the like can be dispensed with; nevertheless they can, of course, equally well be soldered to one another.

The conductor tracks 16 and 17 and/or the contact areas 19, in the event that a separate connection between the conductor tracks 16 and 17 and the antenna connecting lines 27 is intended, are preferably arranged and constructed in such a way that the contact areas 19 do not hamper the heating of the solder paste. In particular, the conductor tracks 16 and 17 and/or the contact areas 19 are arranged in such a way that the sections of the conductor tracks 16 and 17 which are intended to be connected (to be soldered) to the antenna connecting lines 27 come to lie between the connecting points 19, with interspaces; the normally very narrow interspaces between the connecting points (the standard width is 0.2 mm) are preferably designed to be locally wider at the appropriate points.

The chip module 1 according to the invention and described above with respect to its construction is produced as follows:

The starting point is a carrier strip which has neither the bonding holes 21 nor any kind of conductive structures on its surfaces and is preferably provided with the latter whilst still at the carrier strip manufacturer's.

The bonding holes 21 are produced by drilling or stamping.

The conductive structures, put more precisely the conductor tracks 16 and 17 and the contact areas 19, are produced by using an electrically conductive sheet, which can subsequently be applied to the carrier strip. The frame carrier 23 is also produced together with the production of the said conductive structures; the frame carrier 23 is, in the example being considered, likewise a conductive structure, but which is not used as such.

The electrically conductive sheet (a copper sheet in the exemplary embodiment), through which or from which the conductor tracks 16 and 17, the contact areas 19 and the frame carrier 23 are formed or produced, is laminated without additional adhesive onto the corresponding sides of the carrier strip. The conductive sheet may optionally already have the necessary structure or may be appropriately structured only subsequently, that is to say only after being laminated onto the carrier strip.

In the case of subsequent structuring, the sections which are not needed of the conductive sheet are in each case removed chemically, that is to say for example by means of selective etching. The conductive sheet is in this way reduced to the desired geometry. As a result there remain from the conductive sheet on the contact area side 15 the contact areas 19, and on the chip side 14 the conductor tracks 16 and 17 and the frame carrier 23.

The conductor tracks 16 and 17 of chip modules that are adjacent on the carrier strip are, as can be seen from FIG. 1, combined to form a continuous conductor track section. This is possible without problems, since the continuous conductor track section is in any case severed when the chip modules are separated (separation of the chip modules out of the carrier strip along the cut lines 11).

Following the application and the optionally necessary structuring of the conductive sheet, this is subjected to finishing by electroplating. In the exemplary embodiment being considered, a nickel layer is firstly applied to the copper layer formed by the conductive sheet, and a gold layer is applied onto this. In the case of the contact areas 19, this takes place at those places where the bonding holes 21 are located, from both sides of the copper layer forming the contact areas. Instead of the Cu—Ni—Au layer structure, an Au—Ni—Cu—Ag layer structure or any other layer structure capable of being bonded can be provided.

All the conductive structures on the carrier strip are produced in exactly the same way. This means, for the conductor tracks 16 and 17 and the frame carrier 23, that these have exactly the same height and exactly the same physical and chemical properties.

The chips 13 are then bonded onto the carrier strip prepared as described, and electrically connected by means of bonding to the contact areas 19 and the conductor track sections running inside the frame carrier.

Subsequently, the stiffening frame 22 is bonded onto the frame carrier 23 by means of an electrically insulating adhesive.

As a result of the provision of a frame carrier in general and its particular configuration in particular, it is possible to produce between the stiffening frame 22 and the frame carrier 23 a joint which is free of gaps all round and leakproof, by means of which the stiffening frame and the frame carrier are reliably electrically insulated from each other; the conductor tracks 16 and 17 can be short-circuited neither by the stiffening frame 22 nor by the frame carrier 23.

The region enclosed by the stiffening frame 22 is then filled more or less completely with the covering compound 24.

Finally, the chip modules produced in the described way are cut out of the carrier strip and, as shown in FIG. 3, inserted into respective smart card bodies 25 and connected to the latter mechanically and, if appropriate, also electrically.

The chip module that has been described above with respect to the construction and the production is a chip module without a chip island, that is to say a chip module in which the chip is placed onto the carrier. However, the invention can in principle also be applied in the case of chip modules having chip islands, that is to say in the case of chip modules in which the chip is inserted into a cut-out provided in the carrier.

The frame carrier 23 can be used not only for the placement of a stiffening frame 22; it can also provide useful services when no stiffening frame is provided. It is possible, inter alia, to dispense with the said stiffening frame 22 if the chip is covered with a covering compound which, such as a molding compound, a heat-curable covering compound or the like, can be processed without the stiffening frame and itself becomes sufficiently firm (rigid). In this case, the base-like elevation in the form of the previously extensively described frame carrier 23 can serve for the attachment and/or placement of molds or other aids. The production of the chip covering using the frame carrier 23 is in this case advantageous from two points of view: on the one hand it is possible to prevent the chip covering being produced crookedly and/or in any other way deviating from a predefined desired position and/or desired alignment, and on the other hand it is also possible here (for essentially the same reasons as in the case of the provision of a stiffening frame) to prevent sections of the conductor tracks 16 and 17 which run outside the actual chip covering becoming covered with covering compound and thus being made unusable for connections to components provided outside the chip module.

It is also not necessary for the conductor tracks 16 and 17 to be conductor tracks for connecting the chip module to an antenna (coil) provided outside the latter; the base-like elevation in the form of the frame carrier 23 and/or the described electrical connection between the chip module and the smart card body can also advantageously be used when the conductor tracks 16 and 17 have any arbitrary other function than the one described above.

Although it is particularly simple and elegant to produce the base-like elevation like the conductor tracks 16 and 17 and the contact areas 19 and together with the latter, this does not represent any restriction. The base-like elevation can in principle be produced independently of the conductor tracks 16 and 17, from any desired material and in any desired way.

In summary, it can be emphasized that, using the chip module described, it is possible to produce contactless smart cards in particular, but also smart cards, in a fault-free manner significantly more reliably than hitherto.

We claim:

1. A chip module, comprising:
   a carrier and a chip disposed on said carrier;
   a plurality of conductor tracks on said carrier;
   said carrier being formed with a pedestal-type elevation running at least partly around said chip, said elevation being produced in concomitant production steps together with said electric conductor tracks, said electric conductor tracks forming a constituent part of said elevation at mutual intersection points where said electric conductor tracks encounter said elevation, and said elevation forming interruptions disposed such that parts of said elevation formed by said electric conductor tracks cannot be short-circuited by parts of said elevation not formed by said electric conductor tracks.

2. The chip module according to claim 1, wherein said pedestal-type elevation runs completely around said chip.

3. The chip module according to claim 1, wherein said elevation is formed by an electrically conductive structure fitted onto said carrier.

4. The chip module according to claim 1, wherein said elevation is a frame carrier essentially running completely around said chip, and including a stiffening frame placed on said frame carrier.

5. The chip module according to claim 1, wherein said elevation is adapted to have casting molds placed thereon for forming a chip covering on said chip.

6. The chip module according to claim 1, wherein said interruptions are respectively formed between the parts of said elevation formed by said electric conductor tracks and the parts of said elevation not formed by said electric conductor tracks.

7. The chip module according to claim 1, wherein said interruptions are formed so as to be substantially impenetrable by covering compound forming a chip covering.

8. The chip module according to claim 1, which further comprises a stiffening frame bonded onto said elevation with an adhesive, and wherein said interruptions are formed so as to be filled with the adhesive bonding said stiffening frame onto said elevation.

9. The chip module according to claim 1, wherein parts of said elevation formed by said electric conductor tracks do not have a greater height than parts of said elevation not formed by said electric conductor tracks.

10. The chip module according to claim 1, which further comprises a plurality of contact areas on said carrier, and wherein said elevation is produced in concomitant production steps together with said contact areas.

11. The chip module according to claim 10, wherein said contact areas form a constituent part of said elevation at mutual intersection points where said contact areas encounter said elevation.

12. The chip module according to claim 11, wherein said elevation is formed with interruptions disposed such that parts of said elevation formed by said contact areas cannot be short-circuited by parts of said elevation not formed by said contact areas.

13. The chip module according to claim 12, wherein said interruptions are respectively formed between the parts of said elevation formed by said contact areas and the parts of said elevation not formed by said contact areas.

14. The chip module according to claim 11, wherein said interruptions are formed so as to be substantially impenetrable by a covering compound forming a chip covering.

15. The chip module according to claim 11, which further comprises a stiffening frame bonded onto said elevation with an adhesive, and wherein said interruptions are formed so as to be filled with the adhesive bonding said stiffening frame onto said elevation.

16. The chip module according to claim 10, wherein parts of said elevation formed by said contact areas do not have a greater height than parts of said elevation not formed by said contact areas.

17. In a smart card having a smart card body, an improvement comprising:
   a chip module according to claim 1 integrated in said smart card body.

* * * * *